United States Patent
Du et al.

(10) Patent No.: US 9,420,718 B2
(45) Date of Patent: Aug. 16, 2016

(54) ADJUSTABLE DEVICE CARRIER FOR MODULAR CHASSIS

(71) Applicant: Dell Products, L.P., Round Rock, TX (US)

(72) Inventors: Yinggang Du, Austin, TX (US); Michael Harris Morton, Austin, TX (US)

(73) Assignee: DELL PRODUCTS, L.P., Round Rock, TX (US)

( * ) Notice: Subject to any disclaimer, the term of this patent is extended or adjusted under 35 U.S.C. 154(b) by 69 days.

(21) Appl. No.: 14/547,195
(22) Filed: Nov. 19, 2014

(65) Prior Publication Data
US 2016/0157379 A1    Jun. 2, 2016

(51) Int. Cl.
*H05K 7/18* (2006.01)
*H05K 3/32* (2006.01)
*G06F 1/18* (2006.01)

(52) U.S. Cl.
CPC ............... *H05K 7/183* (2013.01); *G06F 1/183* (2013.01); *H05K 3/325* (2013.01)

(58) Field of Classification Search
CPC ........... G06F 1/18; G06F 1/183; G06F 1/187; H05K 3/325; H05K 7/183
USPC ............. 361/679.32, 679.33, 679.34, 679.35, 361/679.36, 679.37, 679.38, 679.39; 211/26
See application file for complete search history.

(56) References Cited

U.S. PATENT DOCUMENTS

| | | | |
|---|---|---|---|
| 5,751,551 A | 5/1998 | Hileman et al. | |
| 6,175,999 B1 | 1/2001 | Sloan et al. | |
| 6,431,718 B1* | 8/2002 | Gamble | G06F 1/184 361/679.33 |
| 7,239,593 B2* | 7/2007 | Abe | G11B 33/124 360/137 |
| 8,300,396 B2* | 10/2012 | Sun | G06F 1/187 248/634 |
| 8,387,933 B2* | 3/2013 | Yu | H05K 7/1491 211/26 |
| 8,427,823 B2* | 4/2013 | Yamada | G11B 33/128 312/223.1 |
| 8,611,081 B2* | 12/2013 | Sun | G11B 33/124 248/222.11 |
| 2003/0019822 A1* | 1/2003 | Liu | F16M 11/42 211/26 |
| 2003/0160010 A1* | 8/2003 | Robertson | H05K 7/1411 211/26 |
| 2003/0206402 A1* | 11/2003 | Tsuyuki | G11B 33/128 361/725 |
| 2004/0264121 A1* | 12/2004 | Orriss | G06F 1/184 361/679.33 |
| 2005/0270737 A1* | 12/2005 | Wilson | G06F 1/184 361/679.37 |
| 2009/0091884 A1* | 4/2009 | Walker | G06F 1/187 361/679.37 |
| 2009/0316349 A1* | 12/2009 | Olesiewicz | G11B 33/124 361/679.33 |
| 2012/0134093 A1* | 5/2012 | Lu | G11B 33/124 361/679.33 |
| 2012/0250244 A1* | 10/2012 | Sun | G11B 33/124 361/679.33 |
| 2012/0273639 A1* | 11/2012 | Sun | G11B 33/124 248/309.1 |
| 2014/0117829 A1* | 5/2014 | Lin | G11B 33/124 312/350 |
| 2015/0043152 A1* | 2/2015 | Zhang | G06F 1/187 361/679.37 |
| 2015/0201522 A1* | 7/2015 | Jau | G11B 33/128 312/330.1 |
| 2016/0073546 A1* | 3/2016 | Chen | H05K 7/183 361/679.33 |

* cited by examiner

*Primary Examiner* — Joshua Rodden
(74) *Attorney, Agent, or Firm* — Fogarty, L.L.C.

(57) ABSTRACT

Adjustable device carriers for modular chassis. In some embodiments, a carrier configured to receive an electronic device may include a front panel and lateral rails coupled to the front panel, where the lateral rails are configured to be inserted into a slot of a modular chassis, where the modular chassis is configured to receive an Information Handling System (IHS), where the IHS is configured to communicate with the electronic device via a backplane, and where the lateral rails have an adjustable length configured to accommodate electronic devices of different sizes.

16 Claims, 5 Drawing Sheets

ADJUSTABLE DEVICE CARRIER FOR MODULAR CHASSIS

FIELD

This disclosure relates generally to computer systems, and more specifically, to adjustable device carriers for modular chassis.

BACKGROUND

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

In some cases, certain IHSs may be housed within a modular chassis. Generally speaking, a modular chassis is a rack or enclosure capable of providing shared power, cooling, networking, and/or management infrastructure to a plurality of IHSs, such as server blades, input/output (I/O) modules, storage devices, switches, etc. One or more of these devices may be inserted into the chassis using a device carrier, which conventionally has had fixed physical dimensions (e.g., fixed depth).

SUMMARY

Embodiments of systems and methods for adjustable device carriers for modular chassis are described herein. In an illustrative, non-limiting embodiment, a carrier may be configured to receive an electronic device, the carrier comprising: a front panel; and lateral rails coupled to the front panel, where the lateral rails are configured to be inserted into a slot of a modular chassis, where the modular chassis is configured to receive an Information Handling System (IHS), where the IHS is configured to communicate with the electronic device via a backplane, and where the lateral rails have an adjustable length configured to accommodate electronic devices of different sizes.

Each of the lateral rails may include two sections coupled via a telescoping system configured to allow the two sections to move along a same axis with respect to one another. Each of the two sections may include at least one hole configured to enable the electronic device to be coupled to the lateral rail and to restrict relative movement between the two sections via the telescoping system.

In some implementations, at least one of the lateral rails may include at least one light guide configured to make a signal visible through the front panel, wherein the signal is provided by at least one of: (a) the backplane of the modular chassis; or (b) the electronic device. For example, the signal may be a power signal or an operation status signal. The telescoping system may include a shield configured to extend an overall length of the at least one light guide. The shield may be configured to redirect at least a portion of the signal to indicate one of at least two different configurations of the carrier via the front panel. The at least one light guide may be configured to indicate a length of the lateral rails. For instance, a first visual indication may correspond to a first length and a second indication may correspond to a second length different from the first length.

In another illustrative, non-limiting embodiment, a modular chassis may include a plurality of slots and at least one device carrier coupled to the plurality of slots, the device carrier further comprising: a front panel; and lateral rails coupled to the front panel, where the lateral rails have an adjustable length configured to accommodate electronic devices of varying sizes. Each of the lateral rails may be configured to be coupled to a corresponding lateral surface of a given electronic device. The given electronic device may include a Hard Disk Drive (HDD).

At least one of the lateral rails may include at least one light guide configured to make a light signal originated from a backplane of the modular chassis visible through the front panel. The at least one light guide may be configured to make a power signal visible through the front panel. The light guide may be configured to make an operation status signal visible through the front panel. The light guide may also be configured to indicate a length of the lateral rails. For example, a first visual indication may correspond to a first length and a second indication may correspond to a second length different from the first length.

In yet another illustrative, non-limiting embodiment, a method may include: receiving an electronic device; receiving a carrier comprising a front panel and lateral rails coupled to the front panel, where the lateral rails have an adjustable length configured to accommodate electronic devices of different sizes, and where each of the lateral rails includes two sections coupled via a telescoping system configured to allow the two sections to move along a same axis with respect to one another; adjusting the length of the lateral rails to match a length of the electronic device; and coupling the electronic device to the carrier, at least in part, by restricting relative movement between the two sections of each of the lateral rails via the telescoping system. The method may also include inserting the carrier into a slot of a modular chassis. In some cases, at least one of the lateral rails may include at least one light guide configured to make a signal visible through the front panel, and the signal may be provided by at least one of: (a) the backplane of the modular chassis; or (b) the electronic device.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail in FIG. 10.

As described above, IHSs may be physically housed within a modular chassis system. Modular chassis or racks are physical enclosures capable of providing shared power, cooling, networking, and/or management infrastructure to a plurality of IHSs, such as server blades, input/output (I/O) modules, storage devices, switches, etc. Examples of storage devices include, but are not limited to, Hard Disk Drives (HDDs), Solid State Drives (SSD), etc. To allow each of these components to be added to and/or removed from the chassis, a carrier system may be used whereby each component is coupled to a device carrier, and the device carrier is then inserted into (and removable from) one of a plurality of slots of the chassis.

Figure 1:
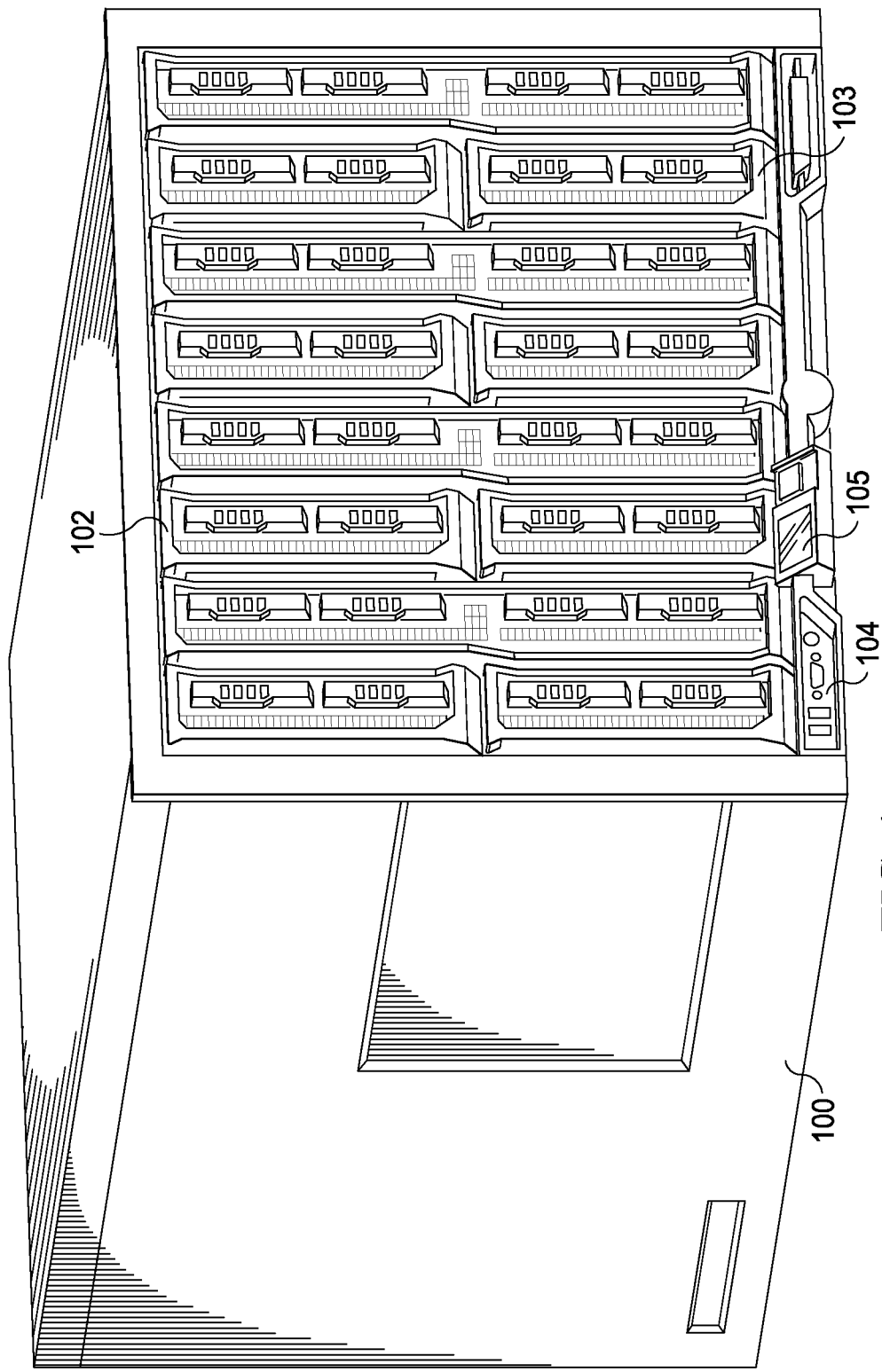
FIG. 1 shows a three-dimensional view of an example of a modular chassis according to some embodiments.

FIG. 1 shows a three-dimensional view illustrating the front end of an example of modular chassis 100 according to some embodiments. Chassis 100 is configured to house a plurality of components, including device carriers 102 and 103, for example. In some cases, at least one of device carriers 102 or 103 may be an adjustable device carrier described herein. In addition, chassis 100 may include display 105 and I/O connectors 104. Display 105 may provide certain status and configuration information regarding the chassis or its various components, whereas I/O connectors 104 may include ports and interfaces such as Universal Serial Bus (USB), audio, video, serial, parallel, Ethernet, etc. that enable a user to interact with the chassis.

Modular chassis 100 may also include a backplane or midplane (not shown) configured to perform internal connections between elements seen in the rear and the front ends of chassis 100. For example, in some cases, communication between the inserted components (e.g., housed by device carriers 102 and 103) and/or rear modules (not shown) may be performed via a vertical, passive backplane or midplane. The backplane or midplane may also include a printed circuit board (PCB) or the like with conductive traces (e.g., copper, etc.) effecting connections between the respective pins of corresponding connectors. For sake of simplicity, the terms "midplane" and "backplane" are used interchangeably herein.

In some implementations, the various modules and components of FIG. 1 may be inserted or removed from chassis 100 while chassis 100 is running or turned on ("hot swapping"). In various configurations, chassis 100 may hold any number (e.g., 32) of quarter-height device carriers, half-height device carriers, full-height device carriers, or any mix of them. It should be noted, however, that modular chassis 100 is described for sake of illustration only, and that many variations (e.g., number of components, distribution of components, etc.) may be present in other chassis.

Figure 2:
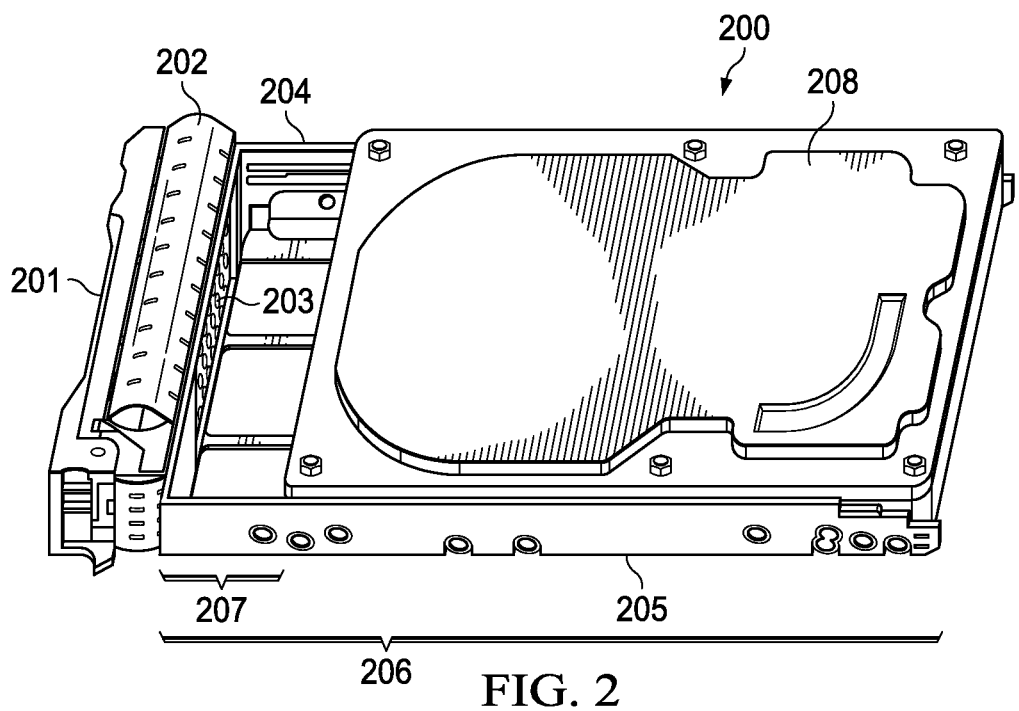
FIG. 2 shows a three-dimensional view of an example of a conventional device carrier with fixed physical dimensions, labeled as "prior art."

FIG. 2 is a three-dimensional view of an example of a prior art, conventional device carrier 200 with fixed physical dimensions. As shown, carrier 200 includes front panel 201 and lateral rails 204 and 205, which are configured to hold electronic device (e.g., HDD) 208. Ventilation element 203 of front panel 201 allows device 208 to be cooled during operation, and spring element 202 allows conventional device carrier 200 to remain secure upon insertion into a slot of chassis 100.

Lateral rails 204 and 205 of conventional device carrier 200 have a fixed, non-adjustable length 206. Because the depth of device 208 is shorter than length 206, empty space 207 results between device 208 and front panel 201.

The inventors hereof have identified a need for as much available volume in chassis 100 as possible. However, designing a new set of shorter, fixed-length device carriers to take advantage of unused space 207 is not practical because it would increase the overall complexity and costs of the system.

Significant constraints to the development of an adjustable device carrier capable of being accommodated by legacy enclosures or chassis, which are addressed by various systems and methods described herein, include, but are not limited to: (a) carrier rails are essentially fully enclosed by drive cage rail slides, often prohibiting any features that may extend or protrude outside of the currently defined lateral rail geometry; and (b) in certain chassis or racks, HDD activity and/or other status LEDs are located on the backplane and displayed via a light pipe to the front of the carrier; therefore an adjustable carrier should accommodate transmission of the light through the carrier.

To address these, and other problems, the inventors hereof have developed various adjustable device carriers for a modular chassis, which are described in more detail below.

Figure 3:
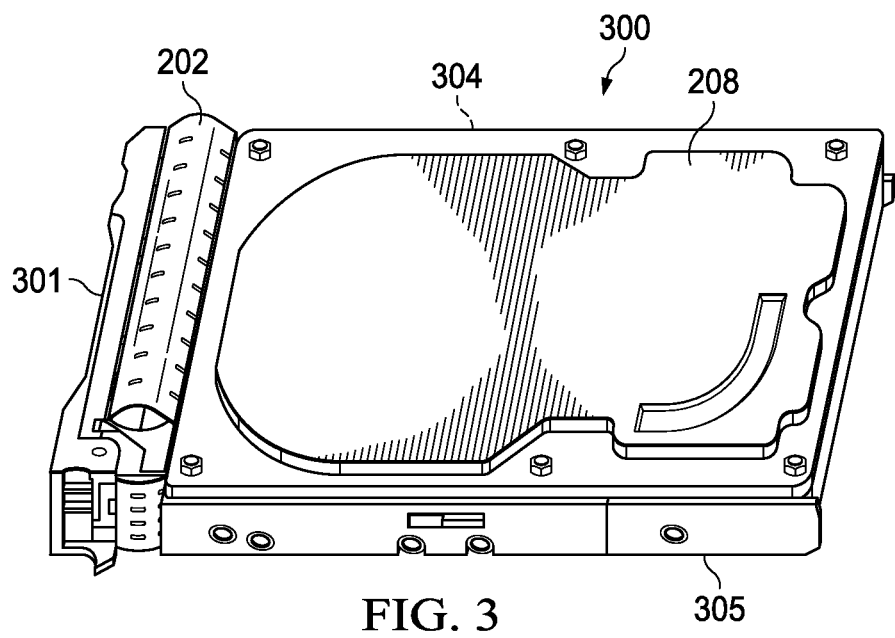
FIG. 3 shows a three-dimensional view of an example of an adjustable device carrier in a compact configuration, according to some embodiments.

FIG. 3 is a three-dimensional view of an example of an adjustable device carrier in compact configuration 300, according to some embodiments. Particularly, the adjustable device carrier includes front panel 301 and adjustable lateral rails 304 and 305, which are configured to hold electronic device 208 (each may have at least one hole configured to enable the electronic device to be coupled to that lateral rail, for example, with a screw). Spring element 202 is also shown.

As depicted, the adjustable device carrier in compact configuration 300, such that empty space 207 of conventional carrier 200 of FIG. 2 is absent.

Figure 4:
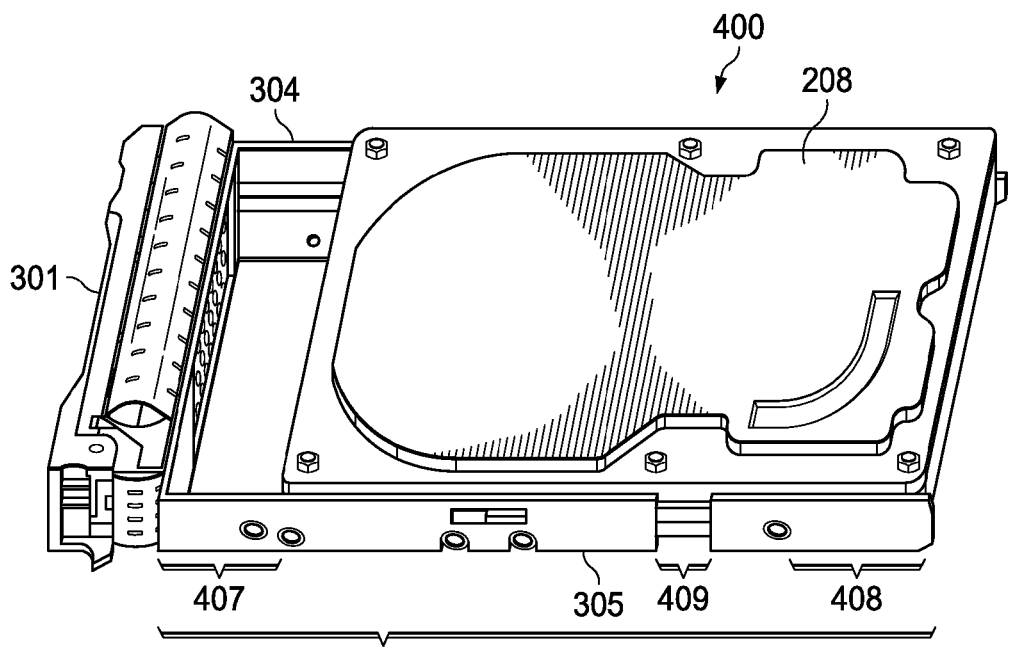
FIG. 4 shows a three-dimensional view of an example of an adjustable device carrier in an extended configuration, according to some embodiments.

FIG. 4 is a three-dimensional view of an example of an adjustable device carrier in extended configuration 400, according to some embodiments. The same carrier of FIG. 3 includes adjustable lateral rails 304 and 305, each of which may have two or more sections, such that two sections of a same lateral rail may be pulled apart from each other (or pushed back together) by distance 409 while still coupled to one another, which in turn creates empty space 407 between device 208 and front panel 301. The overall length 406 of adjustable lateral rails 304 and 305 in extended configuration 400 is longer than the overall length of adjustable lateral rails 304 and 305 in compact configuration 300 by amount 408.

Figure 5:
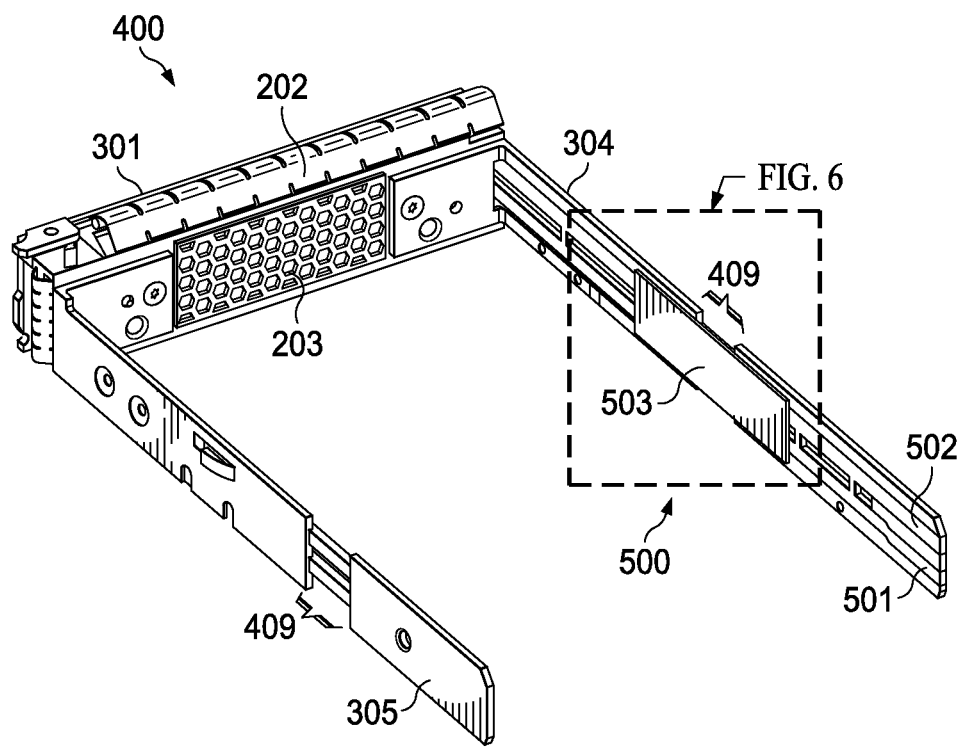
FIG. 5 shows a three-dimensional view of an example of a telescoping system, according to some embodiments.

FIG. 5 is a three-dimensional view of telescoping system 500, according to some embodiments. In this example, the adjustable device carrier is again in extended configuration 400, with adjustable lateral rails 304 and 305 extended by distance 409. Front panel 301 and spring element 202 are also shown. Furthermore, lateral rail 304 includes light guides or pipes 501 and 502. In some cases, light guides 501 and 502 (e.g., a transparent piece of plastic or glass, a fiber optic cable, etc.) may be configured to make a visual signal visible through front panel 301. For instance, such a visual signal (e.g., power, operation, HDD access, etc.) may be provided by the backplane of modular chassis 100 or by electronic device 208. In various embodiments, telescoping system 500 may enable a user to adjust the length of lateral rails 304 and/or 305 to match the depth of electronic device 208; therefore reducing the amount of unusable space within chassis 100. Moreover, telescoping system 500 includes shield 503 configured to extend an overall length of light guides 501 and 502.

Figure 6:
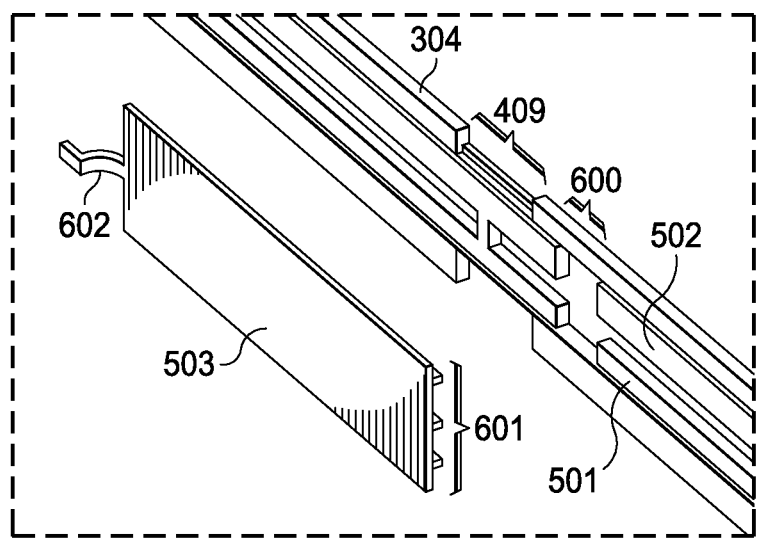
FIG. 6 shows a three-dimensional view of an example of a shield, according to some embodiments.

FIG. 6 is a three-dimensional view of an example of shield 503 removed from lateral rail 304, according to some embodiments. As shown, lateral rail 304 is in extended configuration 400, and therefore distance 409 is shown. In addition, lateral rail 304 includes two light guides 501 and 502, each having a first and a second portion set apart by gap 600.

To bridge gap 600, such that light signals are able to travel through light guides 501 and 502 (e.g., between a backplane of chassis 100 and front panel 301), shield 503 includes a plurality of dividers 601, which are configured to create an optical path between the two sections of light guide 501, and also between the two sections of light guide 502, while maintaining light guide 501 optically isolated from light guide 502. Shield 503 also includes latch 602, which may be configured to couple shield 503 to lateral rail 304.

Figure 7:
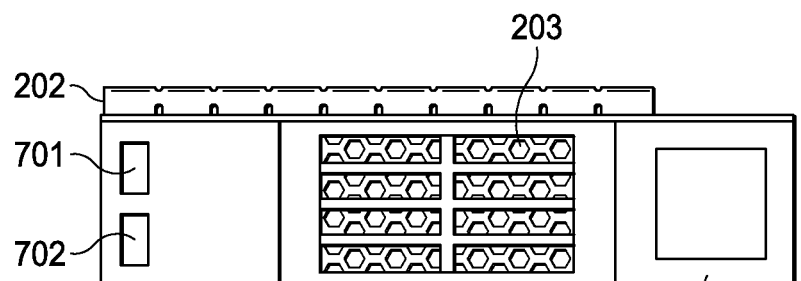
FIG. 7 is a diagram of an example of a front panel of an adjustable device carrier, according to some embodiments.

FIG. 7 is a diagram of front panel 301 of an adjustable device carrier, according to some embodiments. In this example, front panel 301 includes spring element 202 and ventilation element 203, as well as visual indicators 701 and 702. In some embodiments, visual indicator 701 may be optically coupled to light guide 502 and visual indicator 702 may be optically coupled to light guide 501. In other embodiments, however, fewer or more visual indicators may be used in front panel 301.

Figure 8:
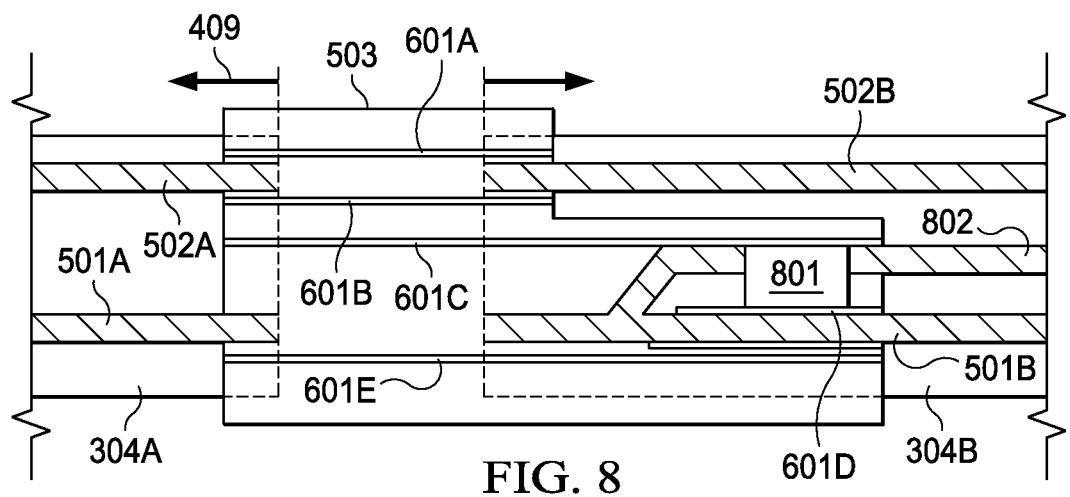
FIG. 8 is a diagram of an example of a lateral rail of an adjustable device carrier with a visual configuration indication in an extended position, according to some embodiments.
Figure 9:
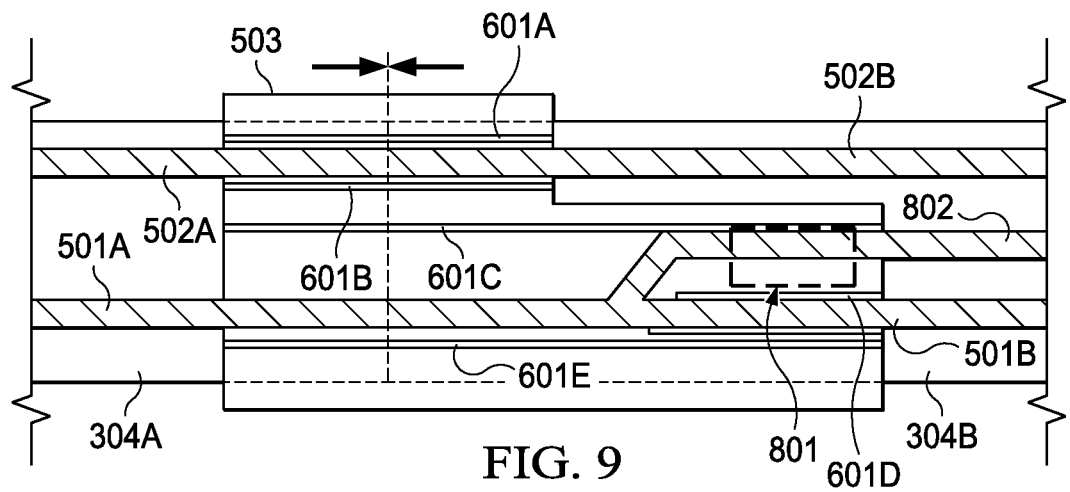
FIG. 9 is a diagram of an example of a lateral rail of an adjustable device carrier with a visual configuration indication in a compact position, according to some embodiments.

FIGS. 8 and 9 are diagrams of lateral rail 304 of an adjustable device carrier with a visual configuration indication shown in its extended and compact positions, respectively. In FIG. 8, first section 304A of lateral rail 304 is separated from second section 304B by distance 409. Similarly, first sections 501A and 502A of light guides 501 and 502 are separated from second sections 501B and 502B, respectively. Shield 503 includes dividers 601A-E configured to optically bridge sections 501A and 501B, and sections 502A with 502B.

In this case, shield 503 includes additional light guide 802, which is coupled to section portion 501B of light guide 501 and is configured to receive a portion of the light signal inserted into first portion 501A of light guide 501. For instance, the light signal inserted into first portion 501A (e.g., by a light emitting diode or LED disposed in a corresponding location on the backplane of chassis 100) may indicate that electrical power is being provided to device 208. Conversely, the light signal inserted into light guide 502A (e.g., by another LED disposed in a corresponding location on the backplane of chassis 100) may indicate HDD activity, access, or status.

Shield 503 also includes mechanical switch or barrier 801 (e.g., an extruded portion of shield 503 similar to latch 602; not shown), which is configured to block the optical path provided by additional light guide 802 when lateral rail 304 is in its extended position. As such, front panel 301 may include an additional a visual indication—that is, in addition or as alternative to visual indicators 701 and 702—that the device carrier is in its extended configuration. In this example, the visual indicator of front panel 301 corresponding to additional light guide 802 may indicate the extended configuration of the device carrier by being dark or unlit.

When in compact position 300, distance 409 is eliminated and mechanical switch 801 is pushed outwards from lateral rail 304, shown in FIG. 9 resting behind additional light guide 802. Therefore, in this configuration, mechanical switch 801 is not in the optical path of additional light guide 802, and the visual indicator of front panel 301 corresponding to additional light guide 802 may indicate the compact configuration of the carrier by being lit (e.g., along with the power light).

In various embodiments, an adjustable device carrier such as described herein may be used in legacy enclosures, and in enclosures designed for a shorter carrier that does not have the unused space in front of the device, as traditional enclosures do. For example, an adjustable device carrier may have lateral rails that may be adjusted in length at the point of assembly with the device (e.g., HDD), to fit whichever enclosure design is needed, with negligible additional assembly complexity and cost.

In some embodiments, each lateral rail may be implemented by a two (or more) part rail with interleaved, overlapping sections that use the same manufacturing processes as current rails. Rail adjustment may be implemented during assembly of the carrier to the HDD, by choice of various available hole and screw locations—which automatically position the rails at the proper length and lock the structure in place, as with single part rails. Existing grounding and other components may be leveraged to create an adjustable light path by creating an enclosed light guide which receives the ends of plastic light pipes or guides. The light pipe fixed in the movable section of the rail translates within the light guide as the rail is attached at the proper location on the drive, providing length variation with negligible visually apparent light loss.

As such, certain systems and methods described herein may enable an IHS manufacturer, for example, to develop new form factors of enclosures which take advantage of the space taken up by conventional carriers, while maintaining transparent backwards compatibly with present-day enclosures or chassis. Often, these adjustable device carriers may replace conventional carriers on a running-change basis, with no other adaption required and no change in use, user experience, or utility.

Figure 10:
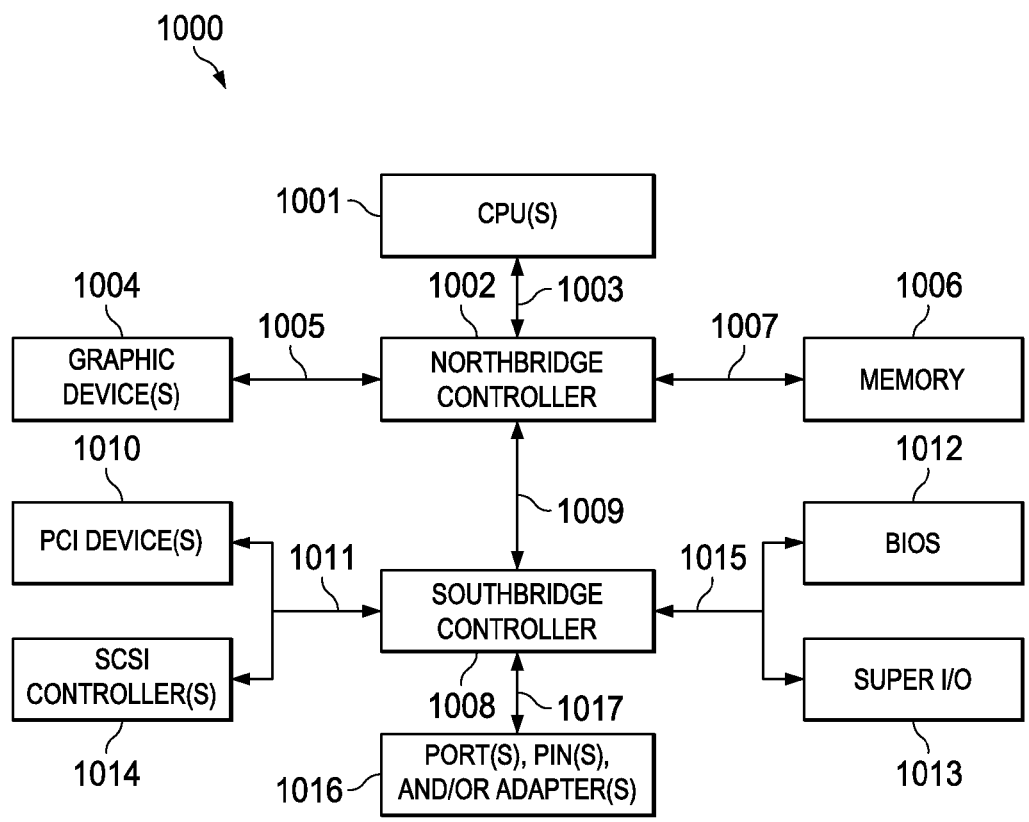
FIG. 10 is a block diagram of an example of an Information Handling System (IHS) according to some embodiments.

FIG. 10 is a block diagram an example of IHS 1000 which may be used in chassis 100. As shown, IHS 1000 includes one or more CPUs 1001. In various embodiments, IHS 1000 may be a single-processor system including one CPU 1001, or a multi-processor system including two or more CPUs 1001 (e.g., two, four, eight, or any other suitable number). CPU(s) 1001 may include any processor capable of executing program instructions. For example, in various embodiments, CPU(s) 1001 may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of CPU(s) 1001 may commonly, but not necessarily, implement the same ISA.

CPU(s) 1001 are coupled to northbridge controller or chipset 1001 via front-side bus 1003. Northbridge controller 1002 may be configured to coordinate I/O traffic between CPU(s) 1001 and other components. For example, in this particular implementation, northbridge controller 1002 is coupled to graphics device(s) 1004 (e.g., one or more video cards or adaptors, etc.) via graphics bus 1005 (e.g., an Accelerated Graphics Port or AGP bus, a Peripheral Component Interconnect or PCI bus, etc.). Northbridge controller 1002 is also coupled to system memory 1006 via memory bus 1007. Memory 1006 may be configured to store program instructions and/or data accessible by CPU(s) 1001. In various embodiments, memory 1006 may be implemented using any suitable memory technology, such as static RAM (SRAM), synchronous dynamic RAM (SDRAM), nonvolatile/Flash-type memory, or any other type of memory.

Northbridge controller 1002 is coupled to southbridge controller or chipset 1008 via internal bus 1009. Generally speaking, southbridge controller 1008 may be configured to handle various of IHS 1000's I/O operations, and it may provide interfaces such as, for instance, Universal Serial Bus (USB), audio, serial, parallel, Ethernet, etc., via port(s), pin(s), and/or adapter(s) 1016 over bus 1017. For example, southbridge controller 1008 may be configured to allow data to be exchanged between IHS 1000 and other devices, such as other IHSs attached to a network. In various embodiments, southbridge controller 1008 may support communication via wired or wireless general data networks, such as any suitable type of Ethernet network, for example; via telecommunications/telephony networks such as analog voice networks or digital fiber communications networks; via storage area networks such as Fiber Channel SANs; or via any other suitable type of network and/or protocol.

Southbridge controller 1008 may also enable connection to one or more keyboards, keypads, touch screens, scanning devices, voice or optical recognition devices, or any other devices suitable for entering or retrieving data. Multiple I/O devices may be present in IHS 1000. In some embodiments, I/O devices may be separate from IHS 1000 and may interact with IHS 100 through a wired or wireless connection. As shown, southbridge controller 1008 is further coupled to one or more PCI devices 1010 (e.g., modems, network cards, sound cards, video cards, etc.) and to one or more SCSI controllers 1014 via parallel bus 1011. Southbridge controller 1008 is also coupled to Basic I/O System (BIOS) 1012 and to Super I/O Controller 1013 via Low Pin Count (LPC) bus 1015.

BIOS 1012 includes non-volatile memory having program instructions stored thereon. Those instructions may be usable CPU(s) 1001 to initialize and test other hardware components and/or to load an Operating System (OS) onto IHS 1000. Super I/O Controller 1013 combines interfaces for a variety of lower bandwidth or low data rate devices. Those devices may include, for example, floppy disks, parallel ports, keyboard and mouse, temperature sensor and fan speed monitoring/control, etc.

In some cases, IHS 1000 may be configured to provide access to different types of computer-accessible media separate from memory 1006. Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to IHS 1000 via northbridge controller 1002 and/or southbridge controller 1008.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

A person of ordinary skill in the art will appreciate that IHS 1000 is merely illustrative and is not intended to limit the scope of the disclosure described herein. In particular, any computer system and/or device may include any combination of hardware or software capable of performing certain operations described herein. In addition, the operations performed by the illustrated components may, in some embodiments, be performed by fewer components or distributed across additional components. Similarly, in other embodiments, the operations of some of the illustrated components may not be performed and/or other additional operations may be available.

For example, in some implementations, northbridge controller 1002 may be combined with southbridge controller 1008, and/or be at least partially incorporated into CPU(s) 1001. In other implementations, one or more of the devices or components shown in FIG. 5 may be absent, or one or more other components may be added. Accordingly, systems and methods described herein may be implemented or executed with other IHS configurations.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A carrier configured to receive an electronic device, the carrier comprising:
   a front panel; and
   lateral rails coupled to the front panel, wherein the lateral rails are configured to be inserted into a slot of a modular chassis, wherein the modular chassis is configured to receive an Information Handling System (IHS), wherein the IHS is configured to communicate with the electronic device via a backplane, wherein the lateral rails have an adjustable length configured to accommodate electronic devices of different sizes, wherein each of the lateral rails includes two sections coupled via a telescoping system configured to allow the two sections to move along a same axis with respect to one another, and wherein at least one of the lateral rails includes at least one light guide configured to make a signal visible through the front panel, and wherein the signal is provided by at least one of: (a) the backplane of the modular chassis; or (b) the electronic device.

2. The carrier of claim 1, wherein each of the two sections includes at least one hole configured to enable the electronic device to be coupled to the lateral rail and to restrict relative movement between the two sections via the telescoping system.

3. The carrier of claim 1, wherein the signal is a power signal or an operation status signal.

4. The carrier of claim 1, wherein the telescoping system includes a shield configured to extend an overall length of the at least one light guide.

5. The carrier of claim 4, wherein the shield is configured to redirect at least a portion of the signal to indicate one of at least two different configurations of the carrier via the front panel.

6. The carrier of claim 5, wherein the at least one light guide is configured to indicate a length of the lateral rails.

7. The carrier of claim 6, wherein a first visual indication corresponds to a first length and wherein a second indication corresponds to a second length different from the first length.

8. A modular chassis, comprising:
   a plurality of slots; and
   at least one device carrier coupled to the plurality of slots, the device carrier further comprising:
      a front panel; and
      lateral rails coupled to the front panel, wherein the lateral rails have an adjustable length configured to accommodate electronic devices of varying sizes, and wherein at least one of the lateral rails includes at least one light guide configured to make a light signal originated from a backplane of the modular chassis visible through the front panel.

9. The modular chassis of claim 8, wherein each of the lateral rails is configured to be coupled to a corresponding lateral surface of a given electronic device.

10. The modular chassis of claim 9, wherein the given electronic device includes a Hard Disk Drive (HDD).

11. The modular chassis of claim 8, wherein the at least one light guide is configured to make a power signal visible through the front panel.

12. The modular chassis of claim 8, wherein the at least one light guide is configured to make an operation status signal visible through the front panel.

13. The modular chassis of claim 8, wherein the at least one light guide is configured to indicate a length of the lateral rails.

14. The modular chassis of claim 13, wherein a first visual indication corresponds to a first length and wherein a second indication corresponds to a second length different from the first length.

15. A method, comprising:
   receiving an electronic device;
   receiving a carrier comprising:
      a front panel; and
      lateral rails coupled to the front panel, wherein the lateral rails have an adjustable length configured to accommodate electronic devices of different sizes, wherein each of the lateral rails includes two sections coupled via a telescoping system configured to allow the two sections to move along a same axis with respect to one another, wherein at least one of the lateral rails includes at least one light guide configured to make a signal visible through the front panel, and wherein the signal is provided by at least one of: (a) a backplane of a modular chassis; or (b) the electronic device;
   adjusting the length of the lateral rails to match a length of the electronic device; and
   coupling the electronic device to the carrier, at least in part, by restricting relative movement between the two sections of each of the lateral rails via the telescoping system.

16. The method of claim 15, further comprising inserting the carrier into a slot of a modular chassis.

* * * * *